US006437400B2

(12) United States Patent
Leobandung

(10) Patent No.: US 6,437,400 B2
(45) Date of Patent: Aug. 20, 2002

(54) SHALLOW TRENCH ISOLATION ON A SILICON SUBSTRATE USING NITROGEN IMPLANT INTO THE SIDE WALL

(75) Inventor: Effendi Leobandung, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/837,136

(22) Filed: Apr. 18, 2001

Related U.S. Application Data

(62) Division of application No. 09/197,168, filed on Nov. 20, 1998, now Pat. No. 6,238,998.

(51) Int. Cl.[7] .............................................. H01L 29/76
(52) U.S. Cl. .................... 257/329; 257/330; 257/333
(58) Field of Search ............................ 438/404, 424, 438/426, 428, 430, 431, 433; 257/329, 330, 333; 357/55, 51, 23.6

(56) References Cited

U.S. PATENT DOCUMENTS

| | | | | |
|---|---|---|---|---|
| 4,571,819 A | * | 2/1986 | Rogers et al. ................. 29/576 |
| 4,656,497 A | * | 4/1987 | Rogers et al. ................. 357/50 |
| 4,824,795 A | | 4/1989 | Blanchard .................... 437/62 |
| 4,918,027 A | | 4/1990 | Fuse et al. .................... 437/35 |
| 5,429,972 A | | 7/1995 | Anjum et al. ................. 437/47 |
| 5,750,435 A | | 5/1998 | Pan ............................. 438/525 |
| 5,811,347 A | | 9/1998 | Gardner et al. .............. 438/435 |
| 5,891,787 A | | 4/1999 | Gardner et al. .............. 438/424 |
| 6,002,160 A | | 12/1999 | He et al. ..................... 257/513 |
| 6,222,230 B1 | * | 4/2001 | Gardner et al. .............. 257/329 |
| 6,228,712 B1 | * | 5/2001 | Kawai et al. ................ 438/257 |
| 6,238,998 B1 | * | 5/2001 | Leobandung ................ 438/404 |
| 6,358,818 B1 | * | 5/2002 | Wu ............................. 438/431 |

OTHER PUBLICATIONS

"Low Temperature Shallow Trench Device Isolation of Semiconductor Material" by G. Bronner & N.C. Lu, IBM Technical Disclosure Bulletin vol. 32, No. 1, Jun., 1989, pp. 468–470.

"Self–Aligned Ion Implanted Oxidation Barrier for Semiconductor Devices" by H.H. Hansen & D.R. Thomas, IBM Technical Disclosure Bulletin, vol. 24, No. 9, Feb., 1982, pp. 4641–4642.

Silicon Processing for the VLSI Era by S. Wolf and R. N. Tauber, vol. 1, pp. 516–517 (1986).

* cited by examiner

Primary Examiner—Olik Chaudhuri
Assistant Examiner—Laura Schillinger
(74) Attorney, Agent, or Firm—RatnerPrestia; Joseph P. Abate, Esq.

(57) ABSTRACT

A process for fabricating a tapered trench on a silicon substrate. The process comprises the steps of forming an initial trench in the substrate and implanting nitrogen ions on the initial trench side walls. More nitrogen ions are implanted adjacent the exposed surface of the substrate than adjacent the trench bottom. Finally, the initial trench side walls are oxidized to create the tapered shape.

3 Claims, 4 Drawing Sheets

SHALLOW TRENCH ISOLATION ON A SILICON SUBSTRATE USING NITROGEN IMPLANT INTO THE SIDE WALL

This application is a divisional of U.S. patent application Ser. No. 09/197,168, filed on Nov. 20, 1998 now U.S. Pat. No. 6,238,998, which has been allowed.

TECHNICAL FIELD

The present invention relates to a process of fabricating a trench on a silicon substrate and, more particularly, to a process of forming a trench having tapered side walls on a silicon-on-insulator (SOI) substrate.

BACKGROUND OF THE INVENTION

An integrated circuit or an array of discrete integrated circuit devices includes numerous semiconductor devices. Current leakages and parasitic capacitances between devices can interfere with the intended operation of the circuit. Therefore, in many circuits, it is necessary to electrically isolate devices from one another. Several isolation techniques have been developed to meet that requirement.

A silicon-on-insulator (SOI) structure is a structure in which a buried insulating layer electrically isolates a silicon layer from a silicon substrate. The SOI structure does not always occupy the entire silicon substrate. Often, the SOI structure occupies only a portion of the silicon substrate.

Shallow Trench Isolation (STI) is a process used in isolating devices formed on SOI substrates. STI involves etching trenches, having side walls and bottoms, in the SOI substrate. Following etching, the trenches are filled with an oxide.

Unfortunately, there is a problem in implementing shallow trench isolation processing (STI) in SOI substrates. Following etching, and before filling the trenches with an oxide, the silicon layer portions of the trench side walls are oxidized. This step produces a bottleneck-shaped trench in which the trench side walls are wider adjacent the trench bottom than adjacent the top of the silicon layer portion of the trench side wall. After the step of oxidizing the silicon layer portion of the trench side walls, the next step in STI processing comprises filling the trenches with an oxide. The bottleneck shape of the trench makes filling the trench with an oxide difficult. This difficulty results in the formation of a seam in the center of the trench. This seam may open up during subsequent processing steps, leading to several problems. For instance, the seam might cause shorts between subsequently deposited poly gates if filled with polysilicon during the poly gate deposition step.

The deficiencies of the conventional processes of fabricating a trench on a silicon substrate using shallow trench isolation (STI) show that a need still exists for a process to eliminate the bottleneck-shaped trench produced after oxidizing the trench side walls. To overcome the shortcomings of the conventional processes, a new process is provided. An object of the present invention is to provide a process for fabricating a trench using STI in which the trench side walls are spaced further apart adjacent the exposed surface than adjacent the trench bottom.

SUMMARY OF THE INVENTION

To achieve these and other objects, and in view of its purposes, the present invention provides a process for fabricating a trench having a tapered shape, side walls, and a bottom on a silicon substrate. The substrate has an exposed surface. The trench side walls are spaced further apart adjacent the exposed surface than adjacent the trench bottom. The process comprises the following steps:

forming an initial trench having initial trench side walls and a trench bottom extending from the exposed surface into an interior of the substrate;

implanting nitrogen ions on the initial trench side walls so that more nitrogen ions are implanted adjacent the exposed surface than adjacent the trench bottom; and oxidizing the trench side walls, thereby creating a trench having the tapered shape.

In a preferred embodiment, the nitrogen ions are implanted on the initial trench side walls at an angle of from about 10 degrees to about 60 degrees relative to the exposed surface.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
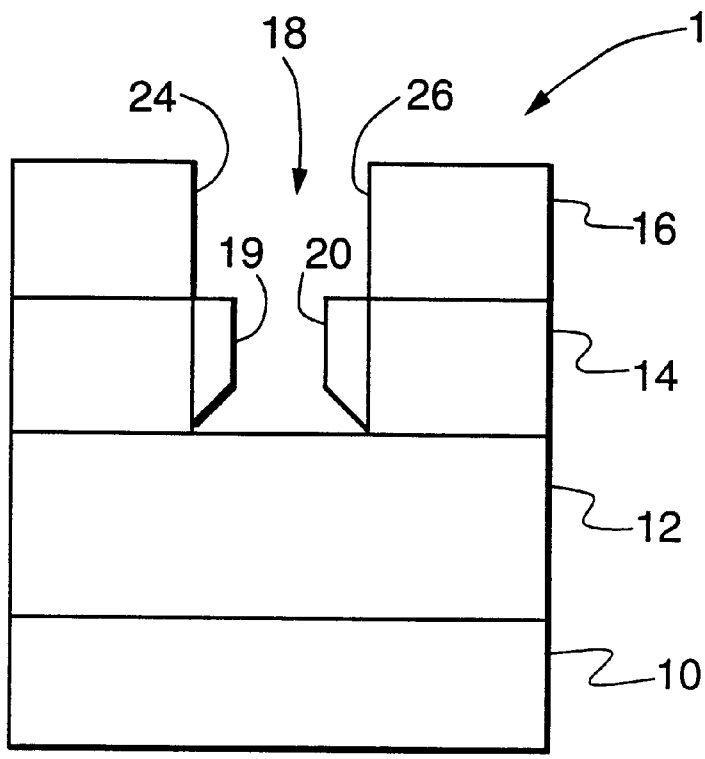
FIG. 1 shows in schematic representation a silicon substrate comprising a trench structure having side walls spaced further apart adjacent the trench bottom than adjacent the top of the silicon layer portion of the trench side wall.

The present invention will next be described with reference to the drawing in which similar numbers indicate the same elements in all figures. Such figures are intended to be illustrative rather than limiting and are included to facilitate the explanation of the apparatus of the present invention. The apparatus is made by the Shallow Trench Isolation (STI) process. The STI process comprises the steps of etching trenches, having side walls and bottoms, in the SOI substrate, oxidizing the silicon layer portions of the trench sidewalls, and filling the trenches with an oxide.

Referring now to the drawing, FIG. 1 shows a side view of a silicon substrate 1 after the steps of etching a trench 18 and oxidizing those portions 19, 20 of the side walls 24, 26 of the trench 18 comprising a silicon layer 14. The substrate 1 comprises a silicon wafer 10, a buried silicon oxide layer 12 formed on the silicon wafer 10, the silicon layer 14, a silicon nitride layer 16, and the trench 18.

Figure 2A:
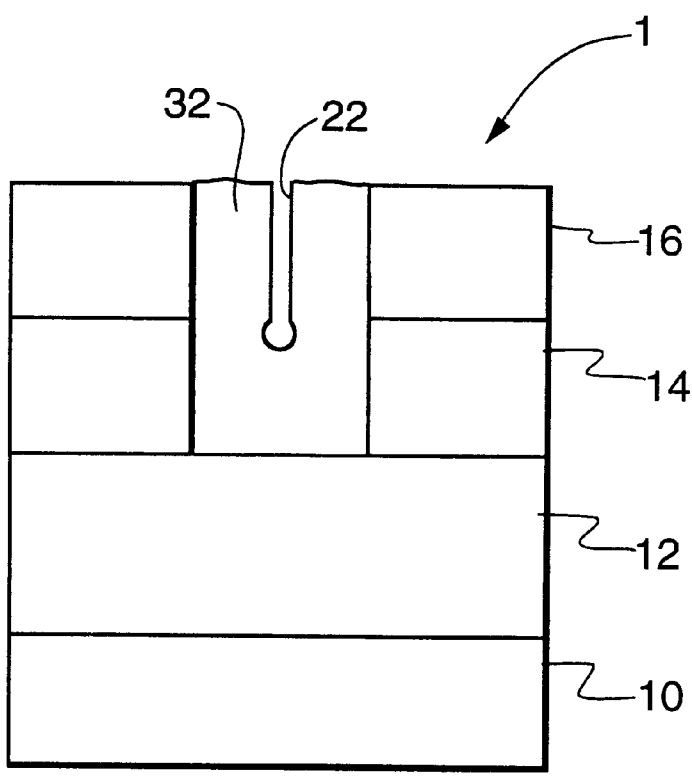
FIG. 2A shows the structure of FIG. 1 after the trench has been filled with an oxide, producing a seam in the center of the trench.

After oxidizing the side walls 24, 26 of the trench 18, the next step in STI processing comprises filling the trench 18 with an oxide 32. As a result of the bottleneck-shape of the trench 18, a shape in which the width of the trench 18 is greater near the bottom then at the top, it is very difficult to fill the trench 18 with an oxide 32. This difficulty results in the formation of a seam 22 in the center of the trench 18 as illustrated in FIG. 2A.

Figure 2B:
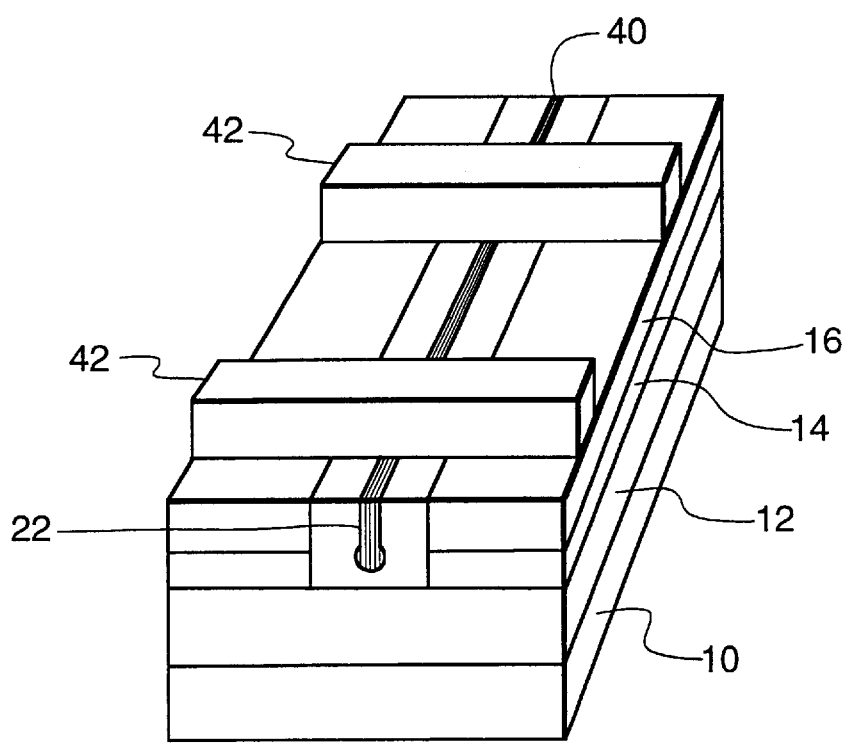
FIG. 2B shows the structure of FIG. 2A after the seam has been filled with polysilicon, causing shorts between deposited poly gates.

The seam 22 may open up during subsequent processing steps, leading to several problems. For instance, FIG. 2B shows the structure of FIG. 2A after the seam 22 has been filled with polysilicon 40. The polysilicon 40 fills the seam 22 during deposition of poly gates 42 and may cause shorts between the poly gates 42.

The present invention provides a process for fabricating a trench 18 using shallow trench isolation (STI) in which the side walls 24, 26 of the trench 18 are spaced further apart adjacent the exposed surface than adjacent the trench bottom. Forming a trench 18 having this structure eliminates the formation of a seam 22 in the center of the trench 18 when the trench 18 is filled with an oxide 32.

Figure 3:
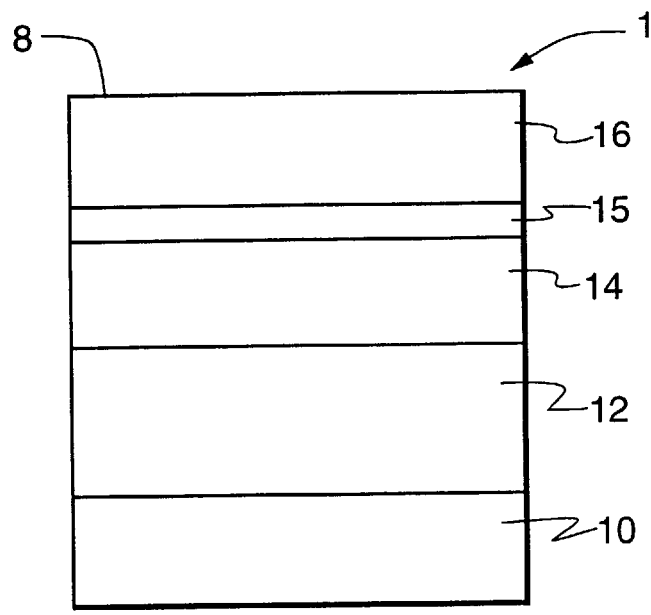
FIG. 3 shows in schematic representation a silicon substrate.

FIG. 3 shows a side view of an embodiment of a silicon substrate comprising a silicon-on-insulator (SOI) substrate 1. In this embodiment, the substrate 1, having an exposed surface 8, comprises a silicon wafer 10, a buried silicon oxide layer 12 formed on the silicon wafer 10, a silicon layer 14, and a silicon nitride layer 16. A thin oxide layer 15 of from about 0.006 $\mu$m to about 0.01 $\mu$m can optionally be deposited between the silicon layer 14 and the silicon nitride layer 16 to reduce damage to the silicon layer 14 caused by deposition of the silicon nitride layer 16.

In a preferred embodiment, the thickness of the silicon oxide layer 12 is from about 0.1 $\mu$m to about 0.4 $\mu$m, the thickness of the silicon layer 14 is from about 0.1 $\mu$m to about 0.2 $\mu$m, and the thickness of the silicon nitride layer 16 is from about 0.1 $\mu$m to about 0.15 $\mu$m. In a more preferred embodiment, the thickness of the silicon oxide layer 12 is about 0.4 $\mu$m, the thickness of the silicon layer 14 is about 0.18 $\mu$m, and the thickness of the silicon nitride layer 16 is about 0.12 $\mu$m.

Figure 4:
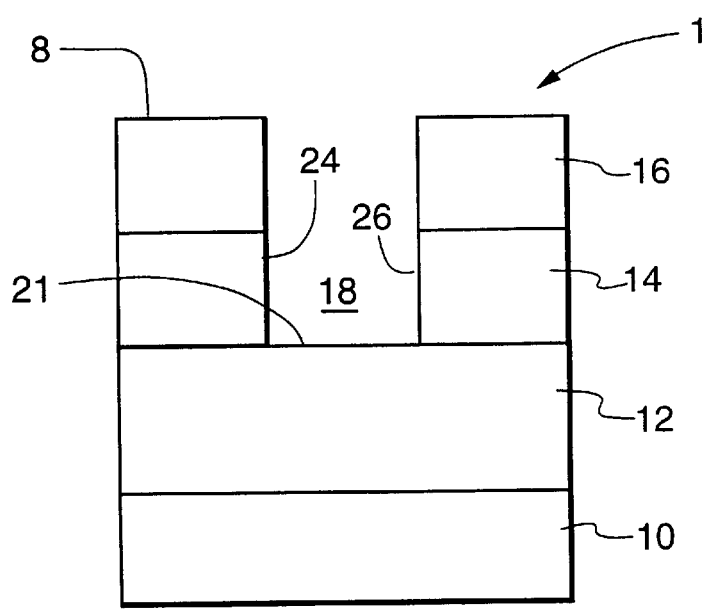
FIG. 4 shows in schematic representation a silicon substrate having a trench with substantially perpendicular side walls.
Figure 5:
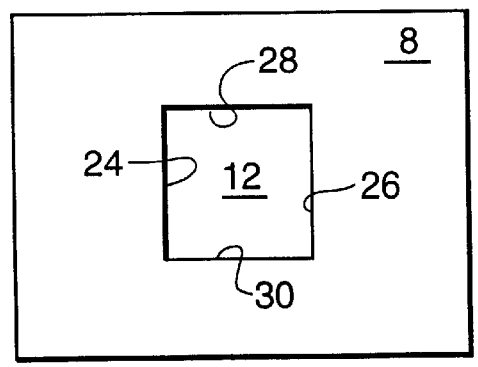
FIG. 5 shows in schematic representation a top view of FIG. 4.

FIG. 4 shows a side view of a substrate 1 having an initial trench 18 extending into the interior of the substrate 1. In FIG. 4, standard photomasking and etching of the silicon substrate 1, through the silicon nitride layer 16, thin oxide layer 15 (if present), and silicon layer 14, results in an initial trench 18 having a bottom 21 and four initial trench side walls 24, 26, 28, and 30. Side walls 24 and 26 are shown in FIG. 4. FIG. 5 is a top view of FIG. 4 showing all four side walls 24, 26, 28, and 30 of initial trench 18. Initial trench side walls 24, 26, 28, and 30 are substantially perpendicular to the exposed surface 8 of the substrate 1.

To form the side walls 24, 26, 28, and 30 of initial trench 18 substantially perpendicular to the exposed surface 8, dry etching techniques, which are well known in the art, are preferred. The initial trench 18 can be cleaned using methods commonly known in the art, which typically include a preliminary step of plasma oxidation stripping or immersion in an inorganic resist stripper, followed by the removal of residual organic contaminants and the desorption of remaining atomic and ionic contaminants. S. Wolf & R. N. Tauber discuss such cleaning processes on pages 516–517 of their text, titled *Silicon Processing for the VLSI Era, Volume 1—Process Technology* (1986).

Figure 6:
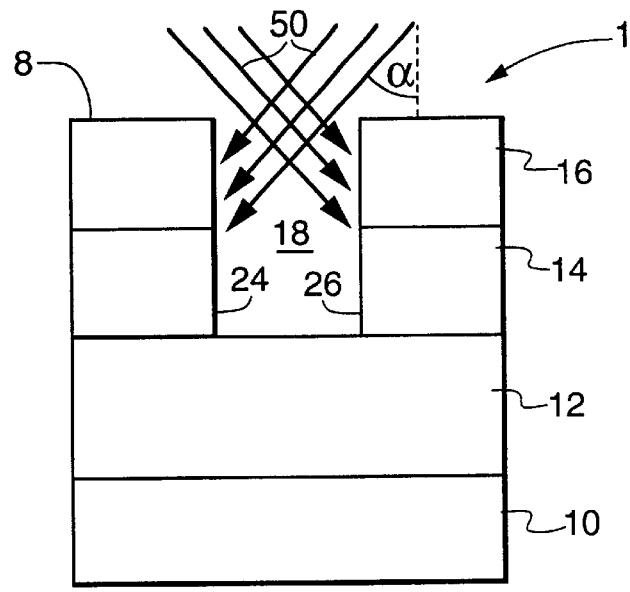
FIG. 6 illustrates the angle to the exposed surface in which nitrogen ions are implanted into the trench side walls.

FIG. 6 shows the step of nitrogen ion implantation into the side walls 24, 26, 28, and 30 of initial trench 18. The nitrogen ions 50 are implanted at an angle ($\alpha$) to the exposed surface 8 of the substrate 1. Ion implantation is a process in which energetic, charged atoms or molecules are directly introduced into a substrate, such as a silicon wafer. At varying orientations, nitrogen ions 50 are implanted on each side wall 24, 26, 28, and 30 of initial trench 18.

In one embodiment, a first position of the substrate 1 is determined so that nitrogen ions 50 are beamed at a direction parallel to side walls 28 and 30 onto side wall 24. The substrate 1 is then rotated by 90 degrees about a rotation axis parallel to the top of the substrate 1 and fixed in a second position. Nitrogen ions 50 are then beamed at a direction parallel to side walls 24 and 26 onto side wall 28. The substrate 1 is then rotated by 90 degrees about a rotation axis parallel to the top of the substrate 1 and fixed in a third position. Nitrogen ions 50 are then beamed at a direction parallel to side walls 28 and 30 onto side wall 26. The substrate 1 is then rotated by 90 degrees about a rotation axis parallel to the top of the substrate 1 and fixed in a fourth position. Nitrogen ions 50 are then beamed at a direction parallel to side walls 24 and 26 onto side wall 30.

The optimal angle ($\alpha$) of nitrogen ion implantation depends on the thickness of the silicon nitride layer 16 and the size of the trench 18. In a preferred embodiment, the side walls 24, 26, 28, and 30 of trench 18 are implanted with from about 5 keV to about 15 keV nitrogen ions 50 to a dose of from about $1 \times 10^{14}/cm^2$ to about $1 \times 10^{15}/cm^2$, and the nitrogen ions 50 are implanted at an angle ($\alpha$) of from about 10 to about 60 degrees relative to the exposed surface 8. In a more preferred embodiment, the side walls 24, 26, 28, and 30 of trench 18 are implanted with about 10 keV nitrogen ions 50 to a dose of about $5 \times 10^{14}/cm^2$ at an angle ($\alpha$) of about 20 degrees. By implanting nitrogen ions 50 at an angle ($\alpha$) relative to the exposed surface 8, more nitrogen ions 50 are implanted adjacent the exposed surface 8 than adjacent the bottom 21 of the trench 18.

Figure 7:
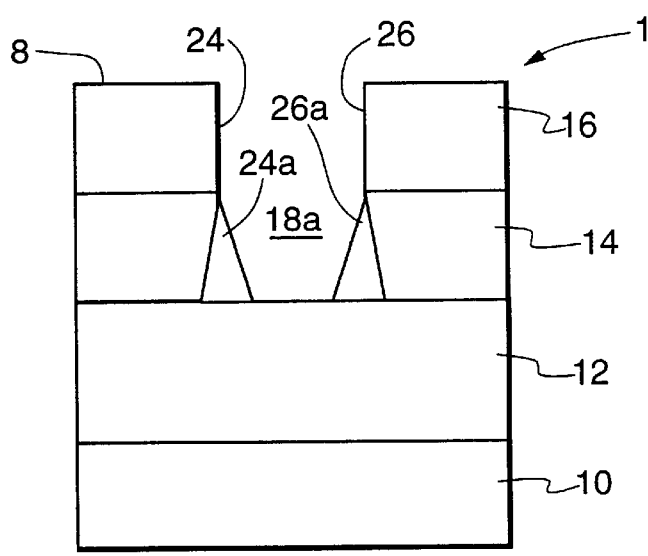
FIG. 7 shows in schematic representation a silicon substrate having a tapered trench structure.

FIG. 7 shows a side view of a resulting tapered trench 18a after oxidation of the side walls 24, 26, 28, and 30 of initial trench 18, resulting in tapered side walls 24a and 26a. The oxidation rate of the side walls 24, 26, 28, and 30 is affected by nitrogen ion concentration which proportionally retards trench side wall oxidation. The high concentration of nitrogen ions in the silicon nitride layer 16, which forms the portion of the side walls 24 and 26 adjacent the exposed surface 8, inhibits oxidation. In contrast, the silicon layer 14, which forms the portion of the side walls 24a and 26a adjacent trench bottom 21, has a lower concentration of nitrogen ions. Oxidation of the portion of the side walls 24a and 26a of the trench 18a adjacent the silicon layer 14 results in oxide formation in proportion to nitrogen ion concentration.

Because the nitrogen ions 50 are implanted at an angle ($\alpha$) relative to the exposed surface 8, more nitrogen ions 50 are implanted into the portion of the side walls 24a and 26a of the trench 18a adjacent the silicon layer 14 and the bottom 21 of the trench 18a than in the silicon nitride layer 16 portion of the side walls 24 and 26 adjacent the exposed surface 8, thereby producing a tapered shape upon oxidation. A portion of silicon layer 14 adjacent the side walls 24a and 26a of the trench 18a is also oxidized. In a preferred embodiment, the side walls 24, 26, 28, and 30 are oxidized using dry oxygen at a temperature of about 1,000° C.

Figure 8:
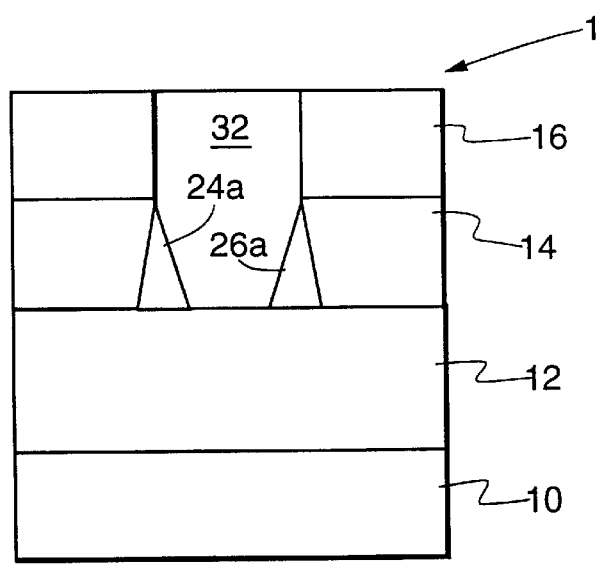
FIG. 8 shows in schematic representation a tapered trench of a silicon substrate that has been filled with oxide.

Following oxidation of the trench sidewalls 24, 26, 28, and 30, the trench is then filled with an oxide 32. FIG. 8 shows a side view of the tapered trench 18*a* shown in FIG. 7 after tapered trench 18*a* has been filled with the oxide 32. Following oxide deposition to fill the trench 18*a,* steps known in the art can be used to complete an STI structure. In addition, the present invention can be used in bulk STI processes.

In one embodiment, a silicon substrate comprising an SOI substrate was formed by the following steps. A 0.4 $\mu$m layer of silicon oxide 12 was formed on a silicon wafer 1 and a 0.18 $\mu$m silicon layer 14 was formed on the silicon oxide layer 12 using the separation by implantation of oxygen (SIMOX) process. A 0.008 $\mu$m layer of silicon oxide (thin silicon oxide layer 15) was next formed on the silicon layer 14 followed by deposition of a 0.12 $\mu$m layer of silicon nitride 16 on the thin silicon oxide layer 15. An initial trench 18 extending from the exposed surface 8 of the substrate 1 into an interior of the substrate was formed by photomasking and plasma etching. The plasma etching was selective to stop at the silicon oxide layer 15, producing a trench depth of 0.308 $\mu$m. The initial trench side walls 24, 26, 28, and 30 were implanted with 10 keV nitrogen ions 50 to a dose of $5 \times 10^{14}/cm^2$ at an angle ($\alpha$) of 30 degrees with respect to the exterior, exposed surface 8 of the substrate 1. The trench side walls 24, 26, 28, and 30 were next oxidized with dry oxygen at 1,000° C., resulting in a tapered trench 18*a* in which the trench side walls 24, 26, 28, and 30 were spaced further apart adjacent the exposed surface 8 of the substrate 1 than adjacent the trench bottom 21.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A silicon substrate having an exposed surface and a trench having a bottom and side walls defining a tapered shape extending through the exposed surface into the substrate, wherein the trench side walls are spaced further apart adjacent the exposed surface than adjacent the trench bottom, and wherein the trench is fabricated by:

forming an initial trench having initial trench side walls and the trench bottom extending from the exposed surface into the substrate;

implanting nitrogen ions on the initial trench side walls wherein more nitrogen ions are implanted adjacent the exposed surface than adjacent the trench bottom; and forming tapered side walls in the initial trench by oxidizing the trench side walls, such that less oxidation occurs adjacent the exposed surface than the trench bottom.

2. The substrate according to claim 1 further comprising a silicon oxide layer on a silicon wafer, a silicon layer on the silicon oxide layer, and a silicon nitride layer on the silicon layer.

3. The substrate according to claim 2 further comprising a thin silicon oxide layer having a thickness of from about 0.006 $\mu$m to about 0.01 $\mu$m between the silicon layer and the silicon nitride layer.

* * * * *